United States Patent
Jeffers et al.

(10) Patent No.: US 7,085,333 B2
(45) Date of Patent: Aug. 1, 2006

(54) CONSTANT-PHASE, GAIN-CONTROLLED AMPLIFICATION CIRCUIT

(75) Inventors: Patrick David Jeffers, Chandler, AZ (US); Michael Kip Eugene Waldo, Phoenix, AZ (US)

(73) Assignee: General Dynamics Decision Systems, Inc., Scottsdale, AZ (US)

( * ) Notice: Subject to any disclaimer, the term of this patent is extended or adjusted under 35 U.S.C. 154(b) by 779 days.

(21) Appl. No.: 10/124,215

(22) Filed: Apr. 15, 2002

(65) Prior Publication Data

US 2003/0194028 A1     Oct. 16, 2003

(51) Int. Cl.
*H04L 27/08*     (2006.01)
(52) U.S. Cl. ............... 375/345; 375/316; 330/254; 330/278
(58) Field of Classification Search ............... 375/345, 375/120, 82, 297, 316; 455/67.1; 348/537; 330/254, 278
See application file for complete search history.

(56) References Cited

U.S. PATENT DOCUMENTS

| | | | | |
|---|---|---|---|---|
| 2,839,750 | A | * | 6/1958 | Kaltenbacher .............. 342/428 |
| 4,677,648 | A | * | 6/1987 | Zurfluh ....................... 375/376 |
| 5,293,545 | A | * | 3/1994 | Huber ......................... 398/198 |
| 5,678,198 | A | * | 10/1997 | Lemson ..................... 455/67.11 |
| 6,510,191 | B1 | * | 1/2003 | Bockelman ................. 375/371 |
| 6,686,969 | B1 | * | 2/2004 | Hara et al. .................. 348/537 |
| 6,721,370 | B1 | * | 4/2004 | Kurihara ..................... 375/297 |
| 6,816,684 | B1 | * | 11/2004 | Grandpierre et al. ....... 398/202 |
| 2001/0015845 | A1 | * | 8/2001 | Ito et al. ..................... 359/189 |
| 2002/0017135 | A1 | * | 2/2002 | Mori et al. ............... 73/504.12 |

* cited by examiner

*Primary Examiner*—Mohammed Ghayour
*Assistant Examiner*—Leila Malek
(74) *Attorney, Agent, or Firm*—Meschkow & Gresham, PLC

(57) ABSTRACT

An amplification circuit (10) is used in a radio receiver (12) to achieve both constant phase shift over the gain range and low intermodulation. A gain-controlled amplifier (16) is desirably optimized for good fidelity, even if at the expense of poor phase linearity. A phase shift compensator (48) compensates for phase non-linearity by imposing a delay of variable duration downstream of the gain-controlled amplifier (16). The delay duration is determined in response to a gain-control signal (20) generated by an AGC circuit (42). The gain-control signal (20) is translated through a look-up table (62) into delay values which control a programmable delay element (64). The programmable delay element (64) generates an adjusted clock signal (54) that drives a digitizer (36). The digitizer (36) both digitizes and delays an amplified signal (32) produced by gain-controlled amplifier (16).

16 Claims, 2 Drawing Sheets

CONSTANT-PHASE, GAIN-CONTROLLED AMPLIFICATION CIRCUIT

TECHNICAL FIELD OF THE INVENTION

The present invention relates generally to automatic gain control (AGC) circuits. More specifically, the present invention relates to gain-controlled amplifiers that may be used in radio receivers and which may benefit from high fidelity while maintaining substantially constant phase shift regardless of gain.

BACKGROUND OF THE INVENTION

Front ends of radio receivers often include gain-controlled amplifiers and automatic gain control (AGC) circuits. An AGC circuit keeps the output signal from the gain-controlled amplifier in a desired amplitude range regardless of input signal level. The desired amplitude range is typically one that allows subsequent signal processing to take place in the most effective manner. For example, when subsequent processing includes digital conversion, the output signal of the gain-controlled amplifier is often managed to use the full range of an analog-to-digital (A/D) converter to minimize the effects of quantization noise, avoid the need for a costly high-resolution A/D converter, and otherwise extend the dynamic range of the radio receiver.

While gain-controlled amplifiers provide significant benefits for receiver designs, they also pose more serious distortion problems than constant-gain amplifiers. Often, communication signals use phase to convey information. Hence, phase distortion can lead to errors in recovering the conveyed information. Often, communication signals use carriers of sufficient bandwidth so that intermodulation falls in the bandwidth of interest, either directly or through aliasing. Intermodulation can also lead to errors in recovering the conveyed information. Gain-controlled amplifiers suffer from these types of distortions more than constant-gain amplifiers.

Conventional gain-controlled amplifiers are often associated with filtering or tuning networks. Often, gain-controlled amplifiers, perhaps in conjunction with such networks, can be devised to minimize phase distortion by causing the amplifier to impart roughly equal amounts of phase shift to signals being amplified at different gains. Unfortunately, such techniques tend to cause intermodulation distortion to become unacceptably prominent. Conversely, conventional gain-controlled amplifier circuits may be devised which minimize the intermodulation distortion. However, these circuits usually suffer from a great degree of phase variance between low gain and high gain, leading to unacceptable phase distortion.

Too often, a radio receiver designer must select components and design filtering and other networks which compromise one type of distortion against the other to find a solution that just manages to work for a given application. This is an undesirable and inflexible approach that often leads to a great reduction in the population of components from which selections can be made. In a typical application, the conventional approach often leads to the use of difficult-to-obtain and expensive components. In many applications, performance suffers because the receiver front end introduces an excessive amount of distortion.

SUMMARY OF THE INVENTION

It is an advantage of the present invention that an improved constant-phase, gain-controlled amplification circuit is provided.

Another advantage of the present invention is that phase constancy is controlled independently of fidelity parameters, such as intermodulation.

Another advantage of the present invention is that a gain-controlled amplifier circuit may be configured to minimize intermodulation and/or other fidelity parameters, then phase distortion is compensated downstream of the gain-control amplifier circuit.

Another advantage of the present invention is that a gain-controlled amplification circuit is used in a radio receiver having a front end which exhibits both low phase distortion and low intermodulation distortion.

Another advantage of the present invention is that a gain-controlled amplification circuit improves radio design flexibility, making a wider range of components available for use in a given application, improving performance, and/or reducing costs.

These and other advantages are realized in one form by a constant-phase, gain-controlled amplification circuit. The amplification circuit includes a gain-controlled amplifier which generates an amplified signal exhibiting a phase shift that varies in response to amplifier gain. An automatic gain control (AGC) circuit is configured to provide a gain-control signal to the gain-controlled amplifier. A phase-shift compensator couples to the AGC circuit and the gain-controlled amplifier. The phase-shift compensator imposes a variable delay on the amplified signal. The variable delay has a duration determined in response to the gain-control signal.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
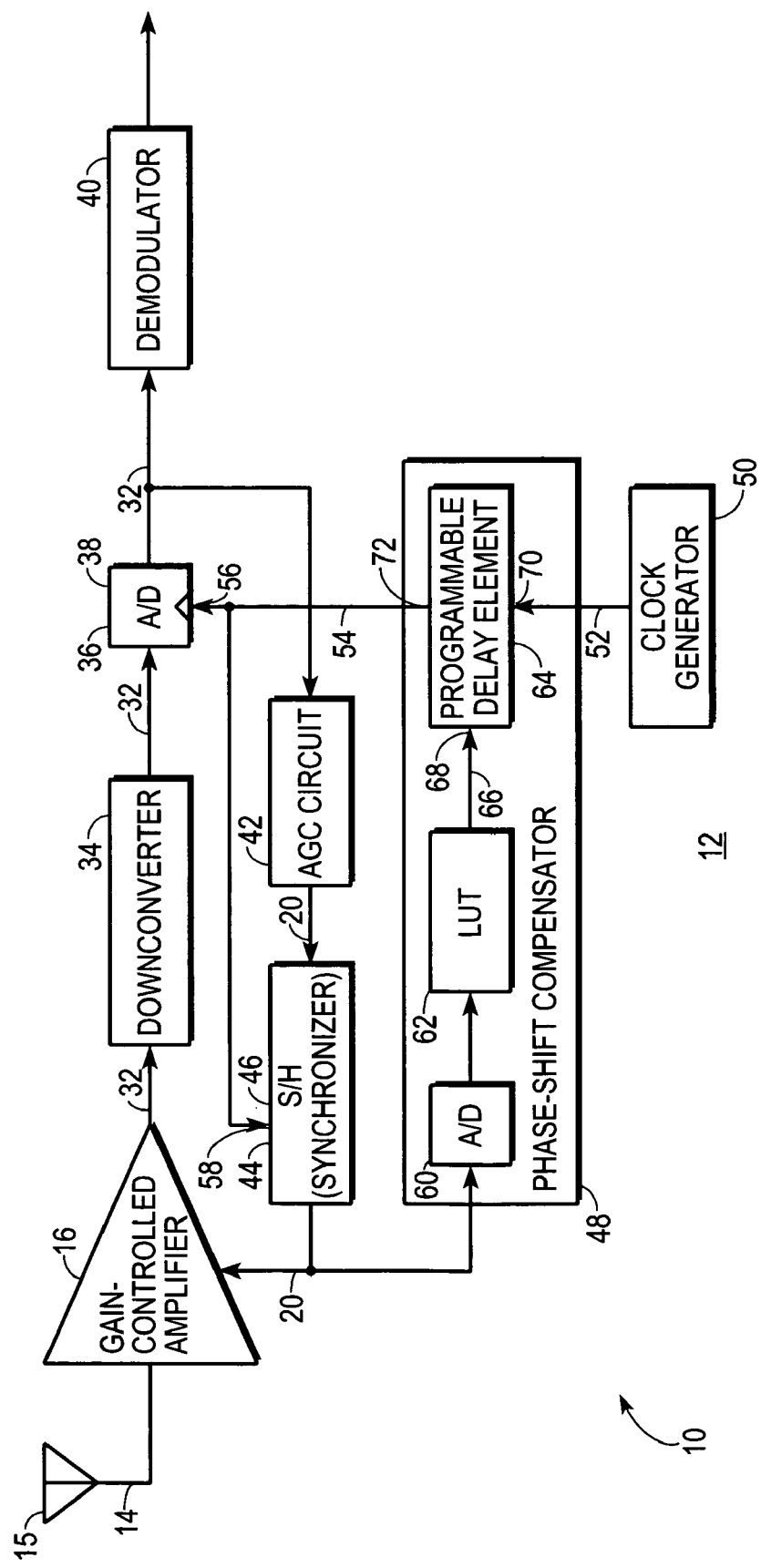
FIG. 1 shows a block diagram of a constant-phase, gain-controlled amplification circuit configured in accordance with a preferred embodiment of the present invention.

FIG. 1 shows a block diagram of a constant-phase, gain-controlled amplification circuit 10 configured in accordance with a preferred embodiment of the present invention. Amplification circuit 10 is used in a radio receiver 12. In this embodiment, an input signal 14 is received at an antenna 15. In other embodiments of the present invention, input signal 14 may be conveyed in other ways, such as by cable, optical fiber, magnetic sensing head, and the like. Input signal 14 is routed to an input of a gain-controlled amplifier 16 in the preferred embodiment.

In the preferred embodiment, gain-controlled amplifier 16 is a radio frequency (RF) semiconductor integrated circuit of a conventional design. Filtering circuits typically associated with RF amplifiers in radio receivers are omitted in FIG. 1 for the sake of clarity. While this preferred embodiment uses gain-controlled amplifier 16 in an RF stage where the problems to which the present invention are directed may be more pronounced, other embodiments can nevertheless use gain-controlled amplifier 16 in an intermediate frequency (IF) stage.

Figure 3:
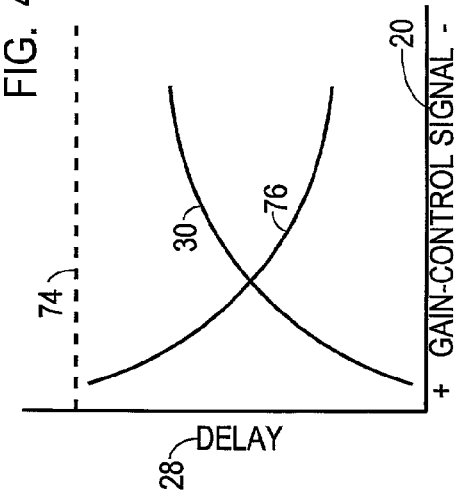
FIG. 3 shows a graph depicting one representative example of the phase linearity exhibited by a gain-controlled amplifier usable in a preferred embodiment of the present invention.
Figure 2:
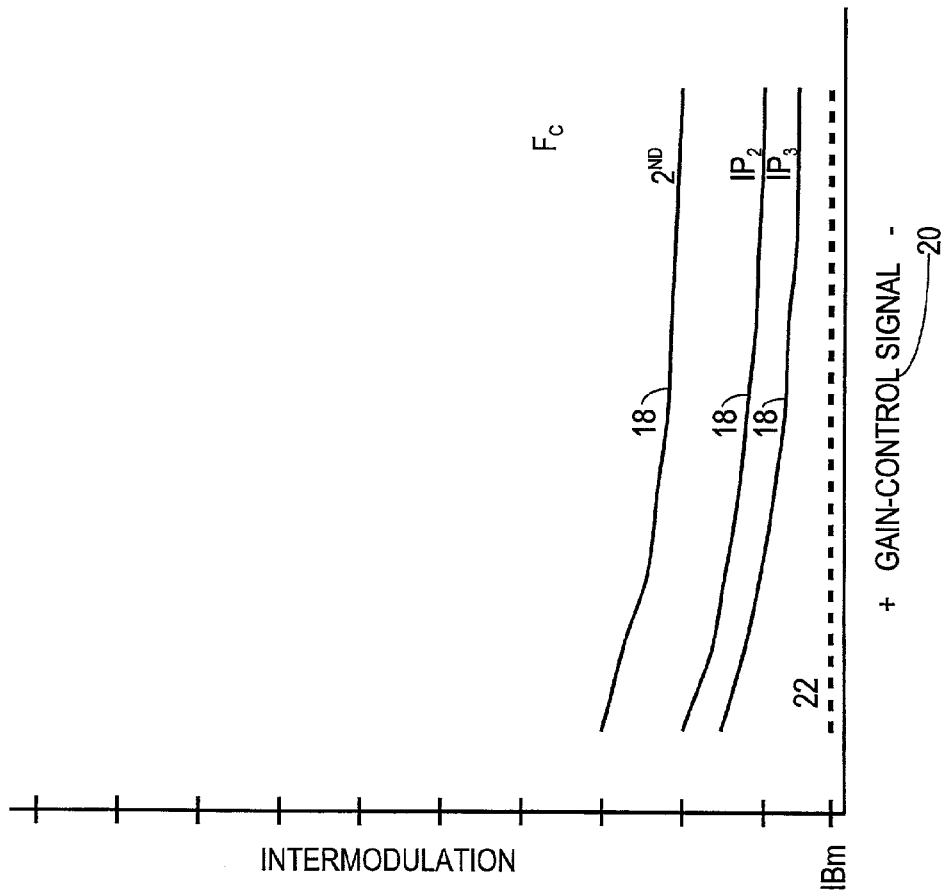
FIG. 2 shows a graph depicting one representative example of the intermodulation exhibited by a gain-controlled amplifier usable in a preferred embodiment of the present invention.

FIG. 2 shows a graph depicting one representative example of the intermodulation exhibited by a gain-controlled amplifier usable in the preferred embodiment of the present invention, and FIG. 3 shows a graph depicting one representative example of the phase linearity exhibited by a gain-controlled amplifier usable in the preferred embodiment of the present invention. Those skilled in the art will appreciate that the graphs of FIGS. 2 and 3 are for exemplary purposes only, and that gain-controlled amplifier 16 may be characterized by graphs vastly different in appearance than those depicted in FIGS. 2 and 3 and/or other parameters that characterize distortion and/or fidelity. Together, FIGS. 2 and 3 partially characterize the fidelity and distortion of a gain-controlled amplifier, such as gain-controlled amplifier 16.

FIG. 2 depicts various orders 18 of intermodulation as a function of a gain-control signal 20. In FIG. 2, a greater gain results from a smaller gain-control signal and a lesser gain results from a greater gain-control signal. FIG. 2 depicts intermodulation 18 in a central region $F_c$ of a frequency band of interest. In a typical gain-controlled amplifier 16, intermodulation 18 would be even less at lower frequencies, but somewhat higher at higher frequencies. In an ideal response 22, depicted as a dotted line, all orders of intermodulation would collapse together at 0 dBm and remain constant regardless of gain-control signal 20. In other words, no intermodulation 18 would be introduced by gain-controlled amplifier 16, regardless of gain or frequency. However, in a real-world gain-controlled amplifier, such as gain-controlled amplifier 16 (FIG. 1), ideal response 22 is not practical. On the other hand, gain-controlled amplifier 16 is desirably configured so that intermodulation 18 is optimized at a relatively low level, even at the expense of worsening the phase linearity depicted in FIG. 3. In other words, fidelity may be optimized at the expense of phase linearity.

FIG. 3 depicts a family of phase shift curves 24. Each phase shift curve 24 generally proceeds from a somewhat greater phase shift at lower frequencies to a somewhat lesser phase shift at higher frequencies. Moreover, phase shift curves 24 are spread out so that, for any given frequency, more phase shift results from operating at a lower gain than from operating at a higher gain. In an ideal response 26, all phase shift curves 24 would collapse onto a single line of constant phase shift. The precise value of that constant phase shift would typically be of little importance. The same phase shift would be imposed regardless of gain or frequency, indicating perfect phase linearity. However, in a real-world gain-controlled amplifier, such as gain-controlled amplifier 16 (FIG. 1), ideal response 26 is not practical. Thus, a certain amount of phase non-linearity is tolerated, as illustrated by the spread between phase shift curves 24 in FIG. 3. Moreover, in the preferred embodiment, phase linearity may be somewhat poor due to the optimization of controlled-gain amplifier 16 for good fidelity.

Figure 4:
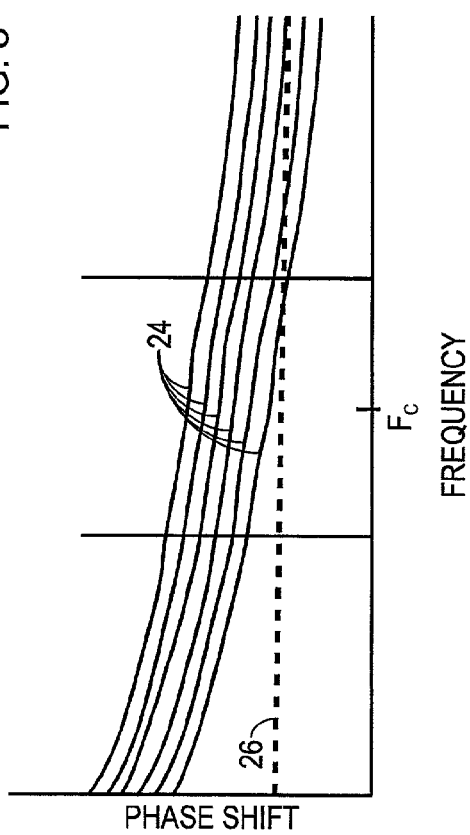
FIG. 4 shows a graph depicting one representative example of delay imposed by a gain-controlled amplifier usable in a preferred embodiment of the present invention as a function of a gain-control signal.

FIG. 4 shows a graph depicting one representative example of the variable delay imposed by a gain-controlled amplifier usable in a preferred embodiment of the present invention as a function of gain-control signal 20. In FIG. 4, a greater gain results from a smaller gain-control signal, and a lesser gain results from a greater gain-control signal. FIG. 4 presents substantially the same information conveyed in phase shift curves 24 of FIG. 3, but in a different form. In particular, frequency and phase shift information have been combined into a single delay parameter 28 in a manner well understood to those skilled in the art, and gain is depicted continuously along one axis of the graph rather than in the discrete curves used in FIG. 3. As illustrated in FIG. 4, the phase non-linearity characteristic causes gain-controlled amplifier 16 to impose a variable delay 28, where the duration of delay 28 changes in response to the gain, as defined by gain control signal 20. Generally, more gain causes gain-controlled amplifier 16 to impose a larger delay 28 than less gain, as indicated by a curve 30.

The optimizing of gain-controlled amplifier 16 for fidelity at the expense of phase linearity is well within the abilities of those skilled in the art. However, while such an optimization is desirable in the preferred embodiment of the present invention, it is not a necessity. By optimizing fidelity, even at the expense of phase linearity, improved fidelity is exhibited by amplification circuit 10 (FIG. 1). The phase non-linearity introduced at gain-controlled amplifier 16 is substantially compensated for in subsequent processing, as discussed below.

Referring back to FIG. 1, gain-controlled amplifier 16 amplifies input signal 14, imposing an unwanted phase non-linearity, and producing an amplified signal 32. The unwanted phase non-linearity is characterized by a phase shift 24 (FIG. 3) or delay 28 (FIG. 4) that varies in response to gain.

Amplified signal 32 is routed to a downconverter 34 in the preferred embodiment. Downconverter 34 is configured in a conventional manner which causes amplification circuit 10 to be usable as radio receiver 12. Downconverter 34 includes mixers, oscillators, and the like, as are typically associated with downconverters in radio receivers. In the preferred embodiment, amplified signal 32, now converted to IF or baseband, passes from downconverter 34 to a digitizer 36. In this embodiment, digitizer 36 is provided by an analog-to-digital (A/D) converter 38.

Digitizer 36 digitizes amplified signal 32 and also imposes a variable delay on amplified signal 32. The delay imposed at digitizer 36 is of a duration that compensates for the phase non-linearity introduced by gain-controlled amplifier 16. Amplified signal 32, now digitized into a digital form, passes from digitizer 36 to a demodulator 40 and to an automatic gain control (AGC) circuit 42 in the preferred embodiment.

Demodulator 40 extracts the information conveyed by input signal 14 and amplified into amplified signal 32, desirably making as few errors as is practical. The more effectively distortions, such as intermodulation (FIG. 2) and phase non-linearity (FIG. 3) can be minimized, the fewer errors demodulator will make, all other conditions being equal. Demodulator 40 may take any form.

AGC circuit 42 may also take any form. In particular, AGC circuit 42 may be a relatively fast or slow AGC circuit, and AGC circuit 42 may be adapted to work with any of a wide variety of modulation formats. AGC circuit 42 may be primarily of a digital construction, as provided for the preferred embodiment, or AGC circuit 42 may alternatively be primarily of an analog construction. In an embodiment of the present invention where AGC circuit 42 is of an analog construction, amplified signal 32 from upstream of digitizer 36 may desirably be used to drive AGC circuit 42 rather than from downstream of digitizer 36 as shown in FIG. 1. Regardless of speed, modulation format, analog or digital construction, and the like, ACG circuit 42 generates gain-control signal 20 in a manner well understood to those skilled in the art. In the preferred embodiment, gain-control signal 20 is an analog signal, but in other embodiments gain-control signal 20 may be a digital signal.

Gain-control signal 20 passes through a synchronizer 44, specifically provided by a sample and hold (S/H) circuit 46 in the preferred embodiment, to a gain-control input of gain-controlled amplifier 16. Gain-control signal 20 also passes to a phase-shift compensator 48. Gain-control signal 20 establishes the amount of gain that gain-controlled amplifier 16 should impart to input signal 14. In addition, gain-control signal 20 also indirectly indicates the duration of delay that gain-controlled amplifier 16 will impose on amplified signal 32. The relationship between gain-control signal 20 and delay is presented in the form of one representative example by curve 30 in FIG. 4.

A clock generator 50 generates a basic clock signal 52 that eventually drives digitizer 36. However, an input of phase-shift compensator 48 is adapted to receive clock signal 52, and phase-shift compensator 48 is configured to generate an adjusted clock signal 54, which is routed to a clock input 56 of A/D 38 and to a clock input 58 of S/H 46 in the preferred embodiment. In generating adjusted clock signal 54, phase-shift compensator 48 delays clock signal 52 by a duration which varies in response to gain-control signal 20.

In the preferred embodiment, phase-shift compensator 48 includes an A/D 60, a look-up table (LUT) 62, and a programmable delay element 64. A/D 60 receives gain-control signal 20, which is in an analog form in the preferred embodiment, and converts signal 20 into a digital form. This digital form of signal 20 couples to address inputs of a memory device which serves as LUT 62. Data outputs of LUT 62 provide a stream of delay values 66, which are provided to control inputs 68 of programmable delay element 64. A signal input 70 of programmable delay element 64 is adapted to receive clock signal 52, and a signal output 72 of programmable delay element 64 generates adjusted clock signal 54.

LUT 64 desirably implements a difference between a constant duration 74 and relationship 30, as depicted by difference relationship 76 in FIG. 4. That constant duration is desirably greater than the greatest delay imposed by gain-controlled amplifier 16. Desirably, the derivative of relationship 30 with respect to gain-control signal 20 substantially equals the negative of the derivative of relationship 76 with respect to gain-control signal 20.

In the preferred embodiment, difference relationship 76 is determined in an empirical manner. For example, gain-controlled amplifiers 16, being semiconductor integrated circuits, are desirably manufactured in relatively large batches. For each batch, one or more gain-controlled amplifiers 16 may be selected and tested to determine the delay imposed on the signal being amplified versus its gain-control signal. LUT 62 may then be programmed with the appropriate difference data, represented as a constant value minus the indicated delay, and formatted as needed so that programmable delay element 64 will implement the specified delays. Since semiconductor devices manufactured in a common batch tend to exhibit like characteristics, the same data may be used for all gain-controlled amplifiers 16 manufactured in a single batch.

Those skilled in the art will appreciate that difference relationship 76 may be implemented in different ways. For example, for some gain-controlled amplifiers 16 difference relationship 76 may approximate a linear or other curve that can be implemented using non-memory circuit design techniques. In the preferred embodiment, the programming of LUT 62 does not change over the life of amplification circuit 10, but this is not a requirement. In other embodiments, circuits and processes located downstream of amplification circuit 10 may monitor amplified signal 32 and/or data produced by demodulator 40 and alter the programming of LUT 62 in a feedback loop that minimizes error in the data.

LUT 62 repetitively translates gain-control signal 20 into a value that specifies a duration. The specified duration changes in response to gain-control signal 20. That duration is then imposed on amplified signal 32. In particular, programmable delay element 64 is desirably a conventional delay chip of the type that is intended for clock de-skewing and timing adjustment. Delay values applied at control input 68 are used to indicate by how much to delay clock signal 52 in order to generate adjusted clock signal 54. In the preferred embodiment, phase-shift compensator 48 merely delays clock signal 52 by a variable duration and does not alter the frequency of clock signal 52 in generating adjusted clock signal 54.

Adjusted clock signal 54 is supplied to input 58 of synchronizer 44 so that amplification circuit 10 will synchronously update the delay imposed through phase-shift compensator 48 on amplified signal 32 with gain-control signal 20 applied to gain-controlled amplifier 16. The next sampling instant defined by adjusted clock signal 54 after gain-control signal 20 changes at gain-controlled amplifier 16 will reflect a new delay responsive to the changed state of gain-control signal 20.

Accordingly, gain-controlled amplifier 16 may introduce differing amounts of phase shift at different gain levels. However, the gain level, as expressed in gain-control signal 20, is translated into delays of variable duration that compensate for the differing amounts of phase shift. As a result, amplified signal 32 output from digitizer 36 and input to demodulator 40 exhibits constant phase. Those skilled in the art will appreciate that constant phase is a relative, not an absolute term. Amplification circuit 10 need only demonstrate phase constancy within a predetermined phase shift tolerance. No absolute phase constancy requirement is imposed on the present invention. Within that context, the present invention provides a constant phase signal relative to the amplified signal 32 output from gain-controlled amplifier 16 that exhibits a phase shift that varies as a function of gain.

In summary, the present invention provides an improved constant-phase, gain-controlled amplification circuit 10. Phase constancy is controlled independently of fidelity parameters, such as intermodulation. Gain-controlled amplifier 16 may be configured to minimize intermodulation and/or other fidelity parameters at the expense of unwanted phase distortion. However, phase distortion is compensated downstream of gain-control amplifier 16. Accordingly, amplification circuit 10 is used in a radio receiver 12 having a front end which exhibits both low phase distortion and low intermodulation distortion. Amplification circuit 10 improves radio design flexibility, making a wider range of components available for use in a given application, improving performance, and/or reducing costs.

Although the preferred embodiments of the invention have been illustrated and described in detail, it will be readily apparent to those skilled in the art that various modifications may be made therein without departing from the spirit of the invention or from the scope of the appended claims. For example, digitizer 36 may be provided in alternate forms. In one example, an A/D may be clocked using a signal with timing determined independently from gain-control signal 20, and a digital interpolator (not shown) may be inserted downstream of the A/D and used to impose the variable delay discussed herein. In another example, an A/D may be clocked using a signal with timing determined independently from gain-control signal 20, and an analog delay element (not shown) may be inserted upstream of the A/D to impose the variable delay discussed herein. In these examples, the interpolator or upstream delay element is a part of digitizer 36 that both digitizes and delays amplified signal 32. In other embodiments, synchronizer 44 may be formed as a part of AGC circuit 42 and/or AGC circuit 42 may provide digital addressing information directly to LUT 62. These and other changes and modifications are intended to be included in the scope of the present invention.

What is claimed is:

1. A constant-phase, gain-controlled amplification circuit comprising:
   a gain-controlled amplifier which generates an amplified signal exhibiting a phase shift that varies in response to amplifier gain;
   an automatic gain control (AGC) circuit configured to provide a gain-control signal to said gain-controlled amplifier; and
   a phase-shift compensator coupled to said AGC circuit and said gain-controlled amplifier, said phase-shift compensator being configured to impose a variable delay on said amplified signal, said variable delay being for a duration determined in response to said gain-control signal.

2. An amplification circuit as claimed in claim 1 additionally comprising a digitizer coupled to said gain-controlled amplifier and said phase-shift compensator, said digitizer being configured to digitize said amplified signal.

3. An amplification circuit as claimed in claim 2 wherein:
   said digitizer comprises an analog-to-digital converter having a clock input which receives an adjusted clock signal; and
   said phase-shift compensator is configured to generate said adjusted clock signal.

4. An amplification circuit as claimed in claim 3 wherein:
   said amplification circuit additionally comprises a clock generator coupled to said phase-shift compensator and configured to generate a clock signal; and
   said phase-shift compensator is configured to generate said adjusted clock signal by delaying said clock signal by a duration which varies in response to said gain-control signal.

5. An amplification circuit as claimed in claim 4 wherein said phase-shift compensator comprises:
   a look-up table having an input responsive to said gain-control signal and an output which supplies delay values; and
   a programmable delay element having a control input responsive to said delay values, a signal input adapted to receive said clock signal, and an output adapted to provide said adjusted clock signal.

6. An amplification circuit as claimed in claim 1 additionally comprising a downconverter coupled to said gain-controlled amplifier and configured so that said amplification circuit is usable as a radio receiver.

7. An amplification circuit as claimed in claim 1 wherein said phase-shift compensator comprises:
   a look-up table having an input responsive to said gain-control signal and an output which supplies delay values; and
   a programmable delay element having a control input responsive to said delay values and an output adapted to delay said amplified signal.

8. An amplification circuit as claimed in claim 1 additionally comprising a synchronizer coupled to said AGC circuit, said gain-controlled amplifier, and said phase-shift compensator, said synchronizer being configured to synchronously update said delay imposed on said amplified signal and said gain-control signal.

9. A method of providing constant-phase, gain-controlled amplification comprising:
   generating a gain-control signal;
   producing, in a gain-controlled amplifier which applies gain determined in response to said gain-control signal, an amplified signal exhibiting a phase shift that varies in response to said gain; and
   imposing a variable delay on said amplified signal, said variable delay changing in response to said gain-control signal.

10. A method as claimed in claim 9 additionally comprising digitizing said amplified signal in a digitizer that imposes said variable delay on said amplified signal.

11. A method as claimed in claim 10 additionally comprising generating, in response to said gain-control signal, an adjusted clock signal that drives said digitizer.

12. A method as claimed in claim 9 additionally comprising:
   translating said gain-control signal into a stream of delay values; and
   delaying a clock signal by durations which are responsive to said delay values to produce an adjusted clock signal, said adjusted clock signal causing said variable delay imposed on said amplified signal.

13. A method as claimed in claim 12 wherein said translating activity is performed in a look up table and said delaying activity is performed in a programmable delay element.

14. A constant-phase, gain-controlled amplification circuit used in a radio receiver, said amplification circuit comprising:
   a gain-controlled amplifier which generates an amplified signal exhibiting a phase shift that varies in response to amplifier gain;
   an automatic gain control (AGC) circuit configured to provide a gain-control signal to said gain-controlled amplifier;
   a digitizer coupled to said gain-controlled amplifier and configured to digitize said amplified signal;
   a clock generator which provides a clock signal; and
   a phase-shift compensator coupled to said AGC circuit, said clock generator, and said gain-controlled amplifier, said phase-shift compensator circuit being configured to impose a delay on said amplified signal by generating an adjusted clock signal which drives said digitizer, said adjusted clock signal being responsive to said clock signal and said gain-control signal.

15. An amplification circuit as claimed in claim 14 wherein said phase-shift compensator comprises:
   a look-up table having an input responsive to said gain-control signal and an output which supplies delay values; and
   a programmable delay element having a control input responsive to said delay values, a signal input responsive to said clock signal, and an output which supplies said adjusted clock signal.

16. An amplification circuit as claimed in claim 15 additionally comprising a downconverter coupled between said gain-controlled amplifier and said digitizer.

* * * * *